(12) United States Patent
Jang et al.

(10) Patent No.: US 11,849,601 B2
(45) Date of Patent: Dec. 19, 2023

(54) DISPLAY APPARATUS AND METHOD OF MANUFACTURING THE SAME

(71) Applicant: SAMSUNG DISPLAY CO., LTD., Yongin-si (KR)

(72) Inventors: Choelmin Jang, Yongin-si (KR); Myungsoo Huh, Yongin-si (KR); Sunghun Key, Yongin-si (KR); Junggon Kim, Yongin-si (KR); Eun Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 127 days.

(21) Appl. No.: 16/719,304

(22) Filed: Dec. 18, 2019

(65) Prior Publication Data
US 2020/0328379 A1    Oct. 15, 2020

(30) Foreign Application Priority Data

Apr. 9, 2019    (KR) .......................... 10-2019-0041502

(51) Int. Cl.
*H10K 50/844*    (2023.01)
*H10K 71/00*    (2023.01)
(Continued)

(52) U.S. Cl.
CPC ......... *H10K 50/8445* (2023.02); *H10K 59/87* (2023.02); *H10K 71/00* (2023.02); *H10K 59/12* (2023.02)

(58) Field of Classification Search
CPC ........... H01L 27/3244; H01L 2251/558; H01L 51/5256; H01L 51/558; H01L 51/5281;
(Continued)

(56) References Cited

U.S. PATENT DOCUMENTS 4,999,215 A * 3/1991 Akagi ................ C08G 73/1028
427/255.6
7,198,832 B2    4/2007 Burrows et al.
(Continued)

FOREIGN PATENT DOCUMENTS

KR    10-2014-0111996    9/2014
KR    10-1737057    5/2017
(Continued)

OTHER PUBLICATIONS

Translation of JP5537308 Fujimoto Takayoshi et al (Jul. 14, 2010). (Year: 2010).*
(Continued)

*Primary Examiner* — Yu-Hsi D Sun
(74) *Attorney, Agent, or Firm* — F. CHAU & ASSOCIATES, LLC

(57) ABSTRACT

A display apparatus includes a substrate, a display portion that includes a plurality of pixels disposed on the substrate, and an encapsulation portion that covers the display portion and includes a hybrid encapsulation layer that includes a plurality of inorganic layers and at least one organic layer that includes a plasma polymer. An end of the hybrid encapsulation layer includes a tip portion that includes an inorganic material and a multi-layered portion which extends from the tip portion toward a central portion of the substrate and in which the plurality of inorganic layers and the at least one organic layer are sequentially and alternately stacked, and a thickness of each of the inorganic layers and the organic layer decreases toward the tip portion.

15 Claims, 12 Drawing Sheets

(51) Int. Cl.
*H10K 59/80* (2023.01)
*H10K 59/12* (2023.01)

(58) Field of Classification Search
CPC ............ H01L 2227/323; C32C 16/4557; C32C 16/401; C32C 16/45551; C32C 16/042; G09F 9/323; G09G 3/32; G02F 1/1345; H10K 59/87
See application file for complete search history.

(56) References Cited

U.S. PATENT DOCUMENTS

| | | | |
|---|---|---|---|
| 8,772,824 B2 | 7/2014 | Lee et al. | |
| 9,153,795 B2 | 10/2015 | Huh et al. | |
| 9,368,749 B2 | 6/2016 | Boesch et al. | |
| 10,319,944 B2 | 6/2019 | Lee et al. | |
| 2004/0253828 A1* | 12/2004 | Ozawa | C23C 16/4405 438/710 |
| 2004/0265508 A9 | 12/2004 | Burrows et al. | |
| 2008/0157664 A1* | 7/2008 | Cok | H01L 51/5234 313/506 |
| 2010/0178481 A1* | 7/2010 | George | C23C 28/00 428/213 |
| 2011/0284801 A1* | 11/2011 | Coelle | C23C 14/46 427/523 |
| 2012/0146492 A1* | 6/2012 | Ryu | H01L 51/5256 313/512 |
| 2012/0313516 A1* | 12/2012 | Kim | H01L 51/5256 313/512 |
| 2013/0244079 A1* | 9/2013 | Mandlik | H01L 51/56 428/68 |
| 2013/0313604 A1* | 11/2013 | Engl | H01L 33/44 257/98 |
| 2013/0334511 A1* | 12/2013 | Savas | H01L 31/02167 257/40 |
| 2015/0171368 A1* | 6/2015 | Vronsky | B05C 11/10 438/7 |
| 2015/0340655 A1* | 11/2015 | Lee | H01L 27/3244 257/40 |
| 2015/0380685 A1* | 12/2015 | Lee | H01L 51/5237 257/40 |
| 2016/0322604 A1* | 11/2016 | Ho | H01L 27/3262 |
| 2018/0122842 A1* | 5/2018 | Saitoh | H01L 27/1225 |
| 2018/0130975 A1* | 5/2018 | Law | H01L 51/5253 |
| 2019/0109300 A1* | 4/2019 | Nominanda | H01L 51/5256 |
| 2019/0305224 A1* | 10/2019 | Hack | H01L 51/5016 |
| 2019/0341576 A1* | 11/2019 | Ochi | H05B 33/22 |
| 2020/0144535 A1* | 5/2020 | Kim | H01L 51/5256 |
| 2020/0266369 A1* | 8/2020 | Xu | H01L 51/5256 |
| 2021/0184165 A1* | 6/2021 | Pan | H01L 51/0097 |

FOREIGN PATENT DOCUMENTS

| | | |
|---|---|---|
| KR | 10-2017-0092174 | 8/2017 |
| KR | 10-2017-0120062 | 10/2017 |

OTHER PUBLICATIONS

Fig. from JP5537308, Fujimoto Takayoshi et al (Jul. 14, 2010). (Year: 2010).*

* cited by examiner

DISPLAY APPARATUS AND METHOD OF MANUFACTURING THE SAME

CROSS-REFERENCE TO RELATED APPLICATION

This application claims priority under 35 U.S.C. § 119 from, and the benefit of, Korean Patent Application No. 10-2019-0041502, filed on Apr. 9, 2019 in the Korean Intellectual Property Office, the contents of which are herein incorporated by reference in their entirety.

BACKGROUND

1. Technical Field

One or more embodiments are directed to a display apparatus and a method of manufacturing the same.

2. Discussion of the Related Art

Displays that visually represent various types of electrical signal information have rapidly advanced, and thus, various display apparatuses that have desirable characteristics, such as small thickness, low weight, low power consumption, etc., have been researched and developed. In particular, display apparatuses that are bendable or foldable according to user's wish have recently been actively researched, and various attempts have been made to allow display apparatuses to be flexible.

Among flexible display apparatuses, organic light-emitting display apparatuses have drawn attention. Organic light-emitting display apparatuses require no additional light source, can be driven at a low voltage, are thin and light, and have a wide viewing angle, high contrast, rapid response, etc., and can thus effectively realize a flexible display apparatus.

SUMMARY

A display apparatus according to one or more embodiments includes at least one encapsulation layer that encapsulates a display device. However, when the display apparatus is bent or folded, fracture or damage to the encapsulation layer may occur. One or more embodiments can provide a display apparatus with improved flexibility of an encapsulation layer and a method of manufacturing the display apparatus.

According to one or more embodiments, a display apparatus includes a substrate, a display portion that includes a plurality of pixels disposed on the substrate, and an encapsulation portion that covers the display portion and includes a hybrid encapsulation layer that includes a plurality of inorganic layers and at least one organic layer that includes a plasma polymer, where an end of the hybrid encapsulation layer includes a tip portion that includes an inorganic material and a multi-layered portion that extends from the tip portion toward a central portion of the substrate and in which the inorganic layers and the at least one organic layer are sequentially and alternately stacked, and a thickness of each of the inorganic layers and the organic layer decreases toward the tip portion.

The plasma polymer may include at least one of hexamethyldisiloxane (HMDSO), furan, or hexane.

The encapsulation portion may further include an inorganic encapsulation layer, and a thickness of the inorganic encapsulation layer may be at least thirty times a thickness of each of the plurality of inorganic layers.

The inorganic layer may have a thickness of about 100 Å to about 300 Å, and the organic layer may have a thickness of about 500 Å to about 2000 Å.

The inorganic layer may include at least one of silicon nitride, silicon oxide, or silicon oxynitride.

The tip portion may include only an inorganic material.

The encapsulation portion may further include an organic encapsulation layer, and a thickness of the organic encapsulation layer may be at least twenty times a thickness of the at least one organic layer.

The encapsulation portion may further include an inorganic encapsulation layer, and the organic encapsulation layer may be disposed between the inorganic encapsulation layer and the hybrid encapsulation layer.

According to one or more embodiments, a method of manufacturing a display apparatus may include forming a display portion on a substrate, the display portion including a plurality of pixels, and forming an encapsulation portion on the substrate, the encapsulation portion covering the display portion, wherein forming the encapsulation portion may include forming a plurality of inorganic layers on the substrate by using a first source gas as a deposition material and forming at least one organic layer on the substrate by using, as a deposition material, a second source gas that includes a plasma polymer that has a molecular weight that is at least two times a molecular weight of the first source gas.

The first source gas may include silane ($SiH_4$) gas.

The plasma polymer may include at least one of hexamethyldisiloxane (HMDSO), furan, or hexane.

Forming the inorganic layers and forming the at least one organic layer may be sequentially and alternately performed.

Forming of the inorganic layer may include using an atomic layer deposition (ALD) method.

Forming the organic layer may include supplying the second source gas to the substrate using a same mask used in forming the inorganic layer.

The method may further include forming an inorganic encapsulation layer on the substrate, and a thickness of the inorganic encapsulation layer may be at least thirty times a thickness of each of the plurality of inorganic layers.

The method may further include forming an organic encapsulation layer on the substrate, and a thickness of the organic encapsulation layer may be at least twenty times a thickness of the at least one organic layer.

The inorganic layer may have a thickness of about 100 Å to about 300 Å, and the organic layer may have a thickness of about 500 Å to about 2000 Å.

According to one or more embodiments, a display apparatus includes an encapsulation portion that includes a hybrid encapsulation layer that includes a plurality of inorganic layers and at least one organic layer that includes a plasma polymer, and an inorganic encapsulation layer, wherein an end of the hybrid encapsulation layer includes a tip portion that includes an inorganic material and a multi-layered portion that extends from the tip portion toward a central portion thereof and in which the inorganic layers and the at least one organic layer are sequentially and alternately stacked, a thickness of each of the inorganic layers and the organic layer decreases toward the tip portion, and a thickness of the inorganic encapsulation layer is at least thirty times a thickness of each of the plurality of inorganic layers.

The encapsulation portion may further include an organic encapsulation layer disposed between the inorganic encapsulation layer and the hybrid encapsulation layer, and a thickness of the organic encapsulation layer is at least twenty times a thickness of the at least one organic layer.

The display apparatus may further include a substrate, and a display portion that includes a plurality of pixels disposed on the substrate, wherein the encapsulation portion covers the display portion.

DETAILED DESCRIPTION

Figure 1:
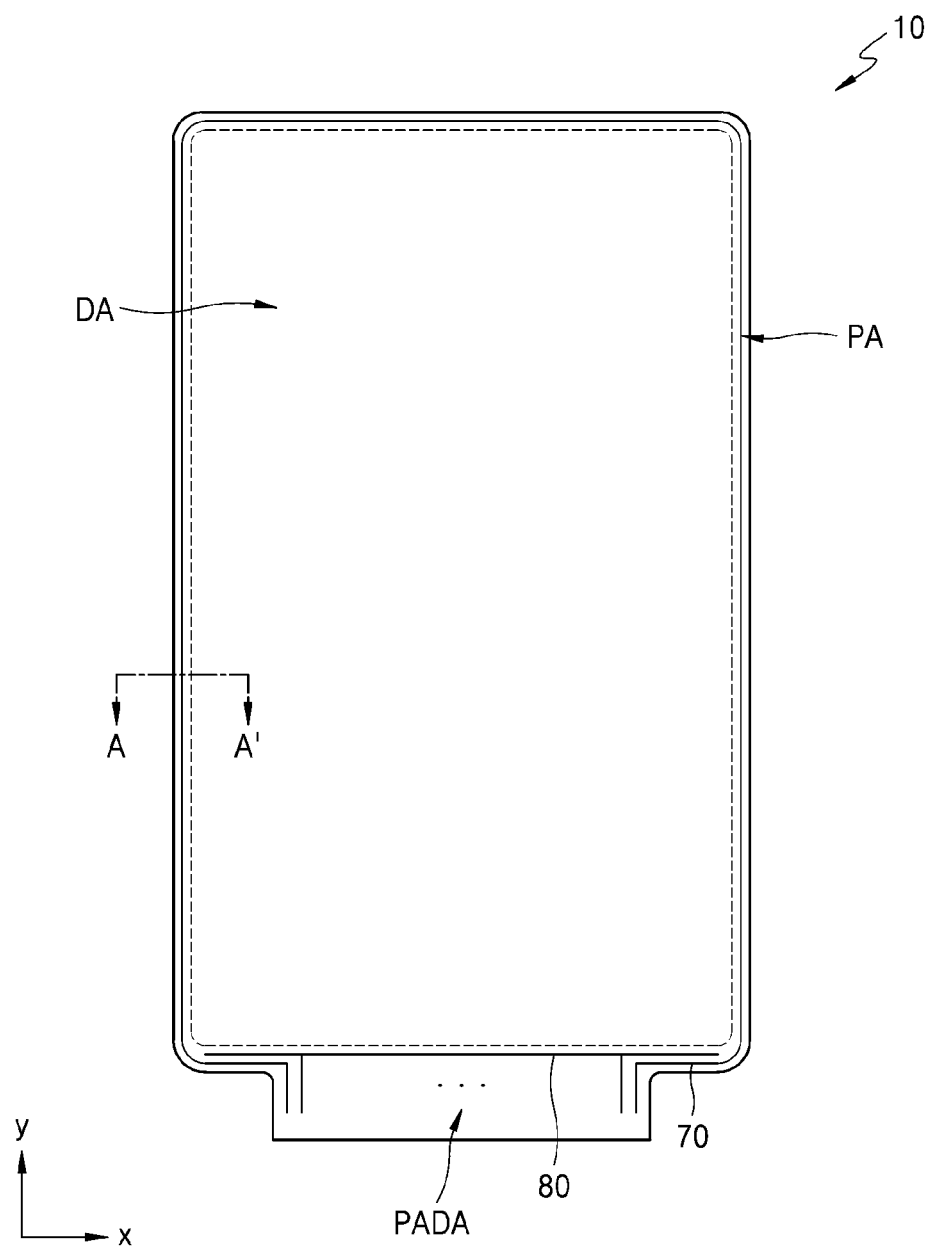
FIG. 1 is a plan view of a display apparatus according to an embodiment.

Reference will now be made in detail to exemplary embodiments, examples of which are illustrated in the accompanying drawings, wherein like reference numerals may refer to like elements throughout. In this regard, the embodiments may have different forms and should not be construed as being limited to the descriptions set forth herein.

It will also be understood that when a layer, a film, a region, a substrate, etc., is referred to as being "on" or "above" another layer, film, region, substrate, etc., it can be directly on the other layer, film, region, substrate, etc., or intervening layer, film, region, substrate, etc., may be present therebetween.

Hereinafter, embodiments of the disclosure will be described in detail with reference to the drawings. In the drawings, like reference numerals may refer to like elements throughout, and repeated descriptions may be omitted. In the drawings, thicknesses of various layers and regions may be enlarged or exaggerated to clearly illustrate the layers and regions, and for convenience of description.

Figure 2:
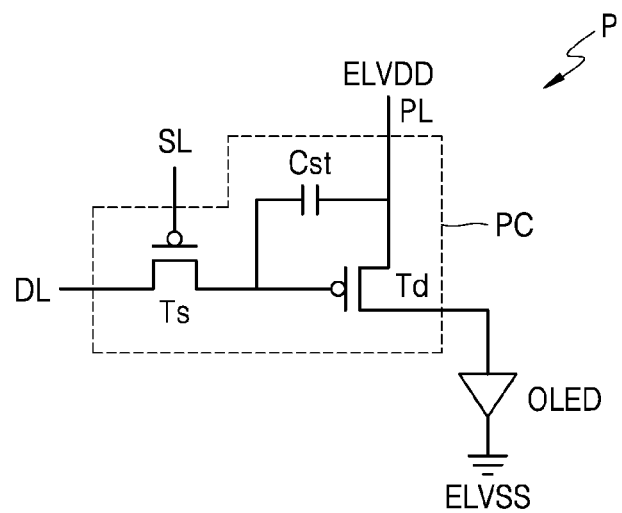
FIG. 2 is an equivalent circuit diagram of a pixel of a display apparatus according to an embodiment.
Figure 3:
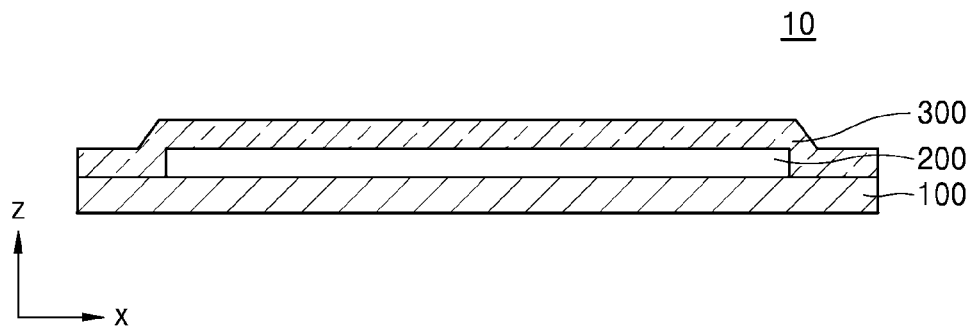
FIG. 3 is a cross-sectional view of a display apparatus according to an embodiment.

FIG. 1 is a plan view of a display apparatus 10 according to an embodiment, FIG. 2 is an equivalent circuit diagram of a pixel of the display apparatus 10 according to an embodiment, and FIG. 3 is a cross-sectional view of the display apparatus 10 according to an embodiment.

Referring to FIG. 1, the display apparatus 10 according to an embodiment includes a display area DA in which an image is displayed and a peripheral area PA located peripherally to the display area DA. A substrate 100 of the display apparatus 10 includes the display area DA and the peripheral area PA.

According to an embodiment, a plurality of pixels P are located in the display area DA. FIG. 2 illustrates an example equivalent circuit diagram of one of the plurality of pixels P. Referring to FIG. 2, the pixel P includes a pixel circuit PC connected to a scan line SL and a data line DL, and a display device connected to the pixel circuit PC. The display device includes, for example, an organic light-emitting diode OLED.

According to an embodiment, the pixel circuit PC includes a driving thin film transistor Td, a switching thin film transistor Ts, and a storage capacitor Cst. The switching thin film transistor Ts is connected to the scan line SL and the data line DL. In addition, the switching thin film transistor Ts transmits to the driving thin film transistor Td a data signal received through the data line DL in response to a scan signal received through the scan line SL. The storage capacitor Cst is connected to the switching thin film transistor Ts and a driving voltage supply line PL. In addition, the storage capacitor Cst stores a voltage that corresponds to a difference between a voltage received from the switching thin film transistor Ts and a driving voltage ELVDD supplied to the driving voltage supply line PL.

According to an embodiment, the driving thin film transistor Td is connected to the driving voltage supply line PL and the storage capacitor Cst. In addition, the driving thin film transistor Td controls a driving current flowing to the organic light-emitting diode OLED from the driving voltage supply line PL in correspondence to a value of the voltage stored in the storage capacitor Cst. The organic light-emitting diode OLED emits light having a brightness that corresponds to the driving current. The organic light-emitting diode OLED may emit, for example, red, green, blue, or white light.

According to an embodiment, FIG. 2 illustrates a case in which the pixel P includes two thin film transistors and one storage capacitor. However, embodiments of the disclosure are not limited thereto. According to other embodiments, the pixel circuit PC of the pixel P may include three or more thin film transistors or may include two or more storage capacitors, to realize various modifications.

As illustrated in FIG. 1, according to an embodiment, the peripheral area PA includes a pad area PADA to which various electronic devices, printed circuit boards, etc., can be electrically attached, and a first voltage line 70 and a second voltage line 80 that supply power that drives the display device are located in the peripheral area PA. The first voltage line 70 includes a common voltage line ELVSS and the second voltage line 80 includes a driving voltage line ELVDD. The first voltage line 70 is connected to an opposite electrode 223, shown in FIG. 4, either directly or through other interconnects, and the second voltage line 80 is connected to the driving voltage supply line PL.

According to an embodiment, FIG. 1 is a plan view that shows the shapes of the substrate 100, a display portion 200, etc. of FIG. 3. In the display apparatus 10 or an electronic device, such as a smartphone, etc., which includes the display apparatus 10, a portion of the substrate 100, etc., may be bent to minimize the area of the peripheral area PA that is recognizable to a user. For example, the substrate 100 can be bent between the pad area PADA and the display area DA so that at least a portion of the pad area PADA overlaps the display area DA. However, the pad area PADA might not cover the display area DA. Rather, the bending direction may be such that the pad area PADA is located behind the display area DA. Thus, the user will perceive that the display area DA mostly occupies the display apparatus 10.

According to an embodiment, the display portion 200 illustrated in FIG. 3 is disposed on the substrate 100, includes the plurality of pixels P, and corresponds to the display area DA. The display portion 200 is covered by an encapsulation portion 300 that protects the display portion 200 from external moisture, foreign materials, etc. For example, both side surfaces and the entire upper surface of the display portion 200 may be covered by the encapsulation portion 300.

Hereinafter, a structure of the display portion 200 and a process of manufacturing the display portion 200 will be described in more detail with reference to FIG. 4.

Figure 4:
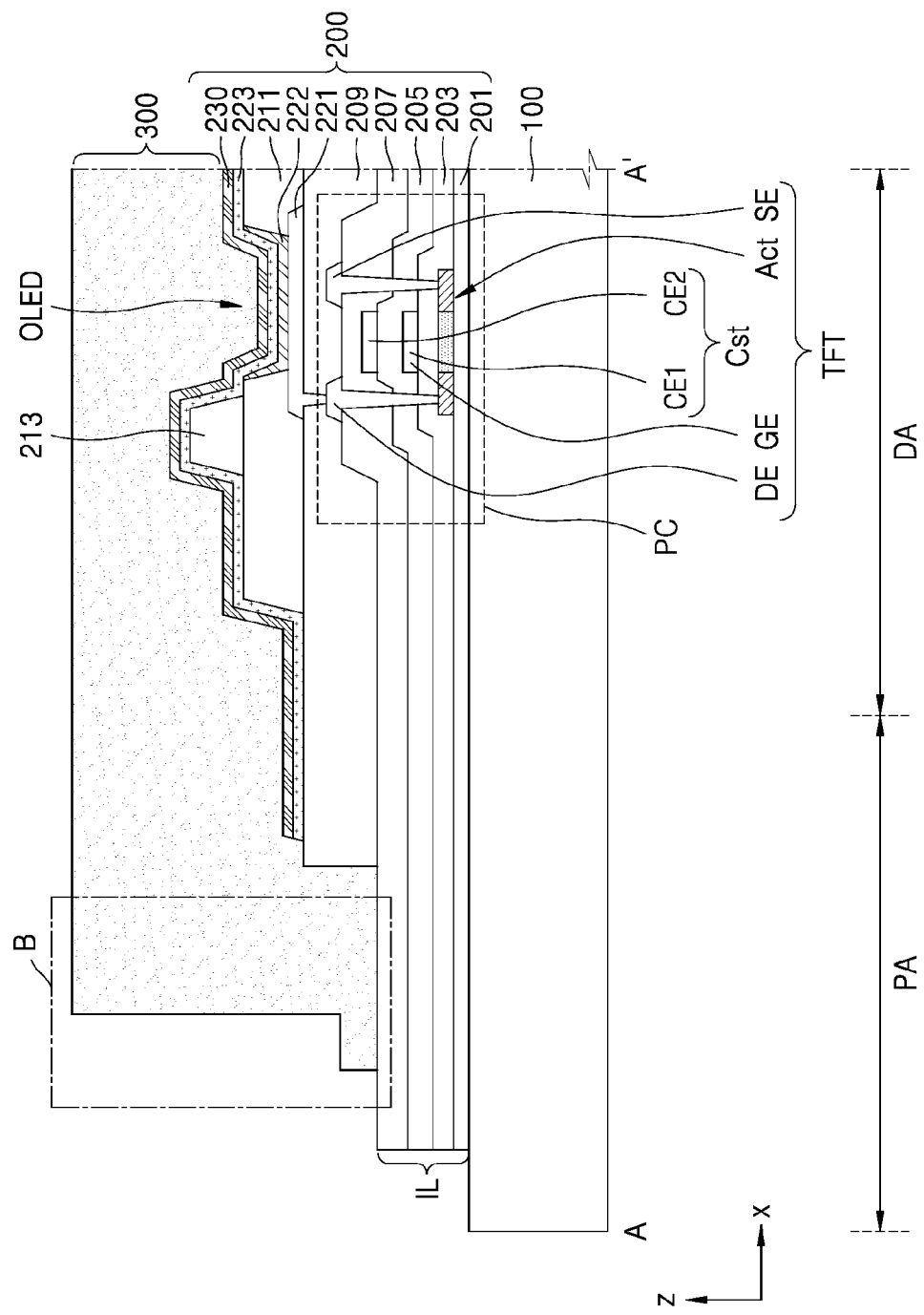
FIG. 4 is a cross-sectional view of a display apparatus taken along line A-A' of FIG. 1.

FIG. 4 is a cross-sectional view of a display apparatus taken along line A-A' of FIG. 1.

Referring to FIG. 4, the display apparatus 10 according to an embodiment includes the display area DA in which the plurality of pixels P are disposed and the peripheral area PA that surrounds the display area DA.

In detail, according to an embodiment, in the display area DA, the pixel circuit PC is disposed on the substrate 100, a pixel electrode 221 is connected to the pixel circuit PC, and an intermediate layer 222 and an opposite electrode 223 are sequentially stacked on the pixel electrode 221.

According to an embodiment, the substrate 100 includes a plurality of layers. For example, the substrate 100 includes a first base layer, a first barrier layer, a second base layer, and a second barrier layer that are sequentially stacked.

According to an embodiment, each of the first and second base layers includes polymer resins. For example, the first and second base layers include polymer resins, such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), etc. The polymer resins described above may be transparent.

According to an embodiment, each of the first and second barrier layers prevents penetration of external foreign materials and each includes a single layer or multiple layers that include an inorganic material, such as silicon nitride ($SiN_x$) or silicon oxide ($SiO_x$).

According to an embodiment, the pixel circuit PC is disposed on the substrate 100 and includes the thin film transistor TFT, the storage capacitor Cst, etc. The organic light-emitting diode OLED that includes the pixel electrode 221, an emission layer of the intermediate layer 222, and the opposite electrode 223 can emit light. The component that includes the pixel circuit PC and the organic light-emitting diode OLEO can be defined as the display portion 200, and the display portion 200 is covered by the encapsulation portion 300.

According to an embodiment, a buffer layer 201 is formed on the substrate 100 to prevent impurities from penetrating into a semiconductor layer Act of the thin film transistor TFT. The buffer layer 201 may include an inorganic insulating material, such as silicon oxynitride (SiON), or $SiO_x$ and may include a single layer or multiple layers that including the inorganic insulating materials disclosed above.

According to an embodiment, the pixel circuit PC is disposed on the buffer layer 201. The pixel circuit PC includes the thin film transistor TFT and the storage capacitor Cst. The thin film transistor TFT includes the semiconductor layer Act, a gate electrode GE, a source electrode SE, and a drain electrode DE. The thin film transistor TFT illustrated in FIG. 4 corresponds to the driving thin film transistor Td described with reference to FIG. 2. According to a present embodiment, a top gate-type thin film transistor is illustrated, in which the gate electrode GE is disposed over the semiconductor layer Act with a gate insulating layer 203 therebetween. However, according to other embodiments, the thin film transistor TFT includes a bottom gate-type thin film transistor.

According to an embodiment, the semiconductor layer Act includes polysilicon. Alternatively, in other embodiments, the semiconductor layer Act may include amorphous silicon, an oxide semiconductor, or an organic semiconductor. The gate electrode GE includes a low-resistance metal. The gate electrode GE includes a conductive material that includes one or more of Mo, Al, Cu, Ti, etc., and may include multiple layers or a single layer that includes the conductive material listed above.

According to an embodiment, the gate insulating layer 203 between the semiconductor layer Act and the gate electrode GE includes an inorganic insulating material, such as $SiO_x$, $SiN_x$, SiON, aluminum oxide, titanium oxide, tantalum oxide, hafnium oxide, etc. The gate insulating layer 203 may include a single layer or multiple layers that include the materials listed above.

According to an embodiment, the source electrode SE and the drain electrode DE include a highly conductive material. The source electrode SE and the drain electrode DE include a conductive material, such as Mo, Al, Cu, Ti, etc., and may include multiple layers or a single layer that include the conductive material listed above. According to an embodiment, the source electrode SE and the drain electrode DE include multiple layers of Ti/Al/Ti.

According to an embodiment, the storage capacitor Cst includes a lower electrode CE1 and an upper electrode CE2 that overlap each other with a first interlayer insulating layer 205 therebetween. The storage capacitor Cst overlaps the thin film transistor TFT. In this regard, FIG. 4 illustrates that the gate electrode GE of the thin film transistor TFT corresponds to the lower electrode CE1 of the storage capacitor Cst. According to another embodiment, the storage capacitor Cst does not overlap the thin film transistor TFT. The storage capacitor Cst is covered by a second interlayer insulating layer 207.

According to an embodiment, the first and second interlayer insulating layers 205 and 207 include an inorganic insulating material, such as $SiO_x$, $SiN_x$, SiON, aluminum oxide, titanium oxide, tantalum oxide, hafnium oxide, etc. The first and second interlayer insulating layers 205 and 207 may include a single layer or multiple layers that include the materials listed above.

According to an embodiment, the pixel circuit PC that includes the thin film transistor TFT and the storage capacitor Cst is covered by a planarization insulating layer 209. An upper surface of the planarization insulating layer 209 is approximately flat. The planarization insulating layer 209 includes an organic insulating material, such as a general-purpose polymer, such as polymethylmethacrylate (PMMA) or polystyrene (PS), a polymer derivative that includes a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. According to an embodiment, the planarization insulating layer 209 includes polyimide (PI). Alternatively, in other embodiments, the planarization insulating layer 209 may include an inorganic insulating material, or may include an inorganic insulating material and an organic insulating material.

According to an embodiment, the pixel electrode 221 is formed on the planarization insulating layer 209. The pixel electrode 221 includes a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the pixel electrode 221 includes a reflective layer that includes one of Ag, Mg, Al, Pt, Pd, Au, Ni, Nd, Ir, or Cr, or a compound thereof. According to another embodiment, the pixel electrode 221 further includes a layer that includes one of ITO, IZO, ZnO or $In_2O_3$ above or below the reflective layer described above.

According to an embodiment, a pixel-defining layer 211 is formed on the pixel electrode 221. The pixel-defining layer 211 includes an opening that exposes an upper surface of the pixel electrode 221 and covers an edge of the pixel electrode 221. The pixel-defining layer 211 includes an organic insulating material. Alternatively, in another embodiment, the pixel-defining layer 211 includes an inorganic insulating material, such as $SiN_x$, SiON, or $SiO_x$. Alternatively, in still other embodiments, the pixel-defining layer 211 includes an organic insulating material and an inorganic insulating material.

According to an embodiment, the upper surface of the pixel electrode 221 is exposed through the opening of the pixel-defining layer 211 and contacts the intermediate layer 222.

According to an embodiment, the intermediate layer 222 may include a low molecular-weight material or a high molecular-weight material. When the intermediate layer 222 includes a low molecular-weight material, the intermediate layer 222 has a structure in which each of a hole injection layer (HIL), a hole transport layer (HTL), an emission layer (EML), an electron transport layer (ETL), and an electron injection layer (EIL) is stacked as a single layer, or each of the HIL, HTL, EML, ETL, and EIL is stacked as multiple layers. The intermediate layer includes various organic materials, such as copper phthalocyanine (CuPc), N,N'-Di (naphthalene-1-yl)-N,N'-diphenyl-benzidine (NPB), tris-8-hydroxyquinoline aluminum (Alq3), etc. These layers can be formed by using a screen printing method, an inkjet printing method, a laser induced thermal imaging (LITI) method, etc.

According to an embodiment, when the intermediate layer 222 includes a high molecular-weight material, the intermediate layer 222 has a structure that includes, for example, an HTL and an EML. Here, the HTL may include poly(3,4-ethylenedioxythiophene) (PEDOT), and the EML may include a polymer material, such as a poly-phenylenevi-nylene (PPV)-based polymer material or a polyfluorene-based polymer material. The structure of the intermediate layer 222 is not necessarily limited thereto, and the intermediate layer 222 may have various structures in other embodiments. For example, in some embodiments, at least one of the layers in the intermediate layer 222 is integrally formed throughout a plurality of pixel electrodes 221. Alternatively, in another embodiment, the intermediate layer 222 includes layers patterned to respectively correspond to the plurality of pixel electrodes 210.

According to an embodiment, the opposite electrode 223 includes a conductive material that has a low work function. For example, the opposite electrode 223 includes a (semi) transparent layer that includes one of Ag, Mg, Al, Pt, Pd, Au, Ni, Nd, Ir, Cr, Li, or Ca, or an alloy thereof. Alternatively, in another embodiment, the opposite electrode 223 furthers include a layer, such as ITO, IZO, ZnO, or $In_2O_3$, on the (semi) transparent layer that includes the materials listed above. The opposite electrode 223 is disposed not only in the display area DA, but also in a peripheral area PA. The intermediate layer 222 and the opposite electrode 223 are formed by using a thermal deposition method.

According to an embodiment, a capping layer 230 is located on the opposite electrode 223. The capping layer 230 includes LiF and is formed by using a thermal deposition method. Alternatively, in another embodiment, the capping layer 230 includes an inorganic insulating material, such as $SiO_x$, $SiN_x$, or SiON. Alternatively, in still another embodiment, the capping layer 230 is omitted.

According to an embodiment, a spacer 213 is formed on the pixel-defining layer 211. The spacer 213 includes an organic insulating material, such as PI. Alternatively, in other embodiments, the spacer 213 includes an inorganic insulating material, such as $SiN_x$ or $SiO_x$, or an organic insulating material and an inorganic insulating material.

According to an embodiment, the spacer 213 includes a different material from the pixel-defining layer 211. Alternatively, in another embodiment, the spacer 213 includes the same material as the pixel-defining layer 211, and in this case, the pixel-defining layer 211 and the spacer 213 can be formed together by using a mask process that uses a half tone mask, etc. According to an embodiment, the pixel-defining layer 211 and the spacer 213 include PI.

According to an embodiment, the organic light-emitting diode OLED is covered by the encapsulation portion 300. As illustrated in FIG. 4, the encapsulation portion 300 covers ends of a common layer, such as the opposite electrode 223 and the capping layer 230, and an inorganic insulating layer IL is disposed between the substrate 100 and the encapsulation portion 300. Here, the inorganic insulating layer IL includes an inorganic material, and the inorganic insulating layer IL includes at least one of the buffer layer 201, the gate insulating layer 203, or the first and second interlayer insulating layers 205 and 207. At an end of the substrate 100, the encapsulation portion 300 contacts an upper surface of the inorganic insulating layer IL and an uppermost layer, such as the second interlayer insulating layer 207, of the inorganic insulating layer IL includes an $SiN_x$ layer that adheres to a lowermost layer, such as an inorganic encapsulation layer 310 shown in FIG. 5A, of the encapsulation portion 300, to be described below. A detailed structure of the encapsulation portion 300 will be described below with reference to FIGS. 5A through 5C.

Figure 5A:
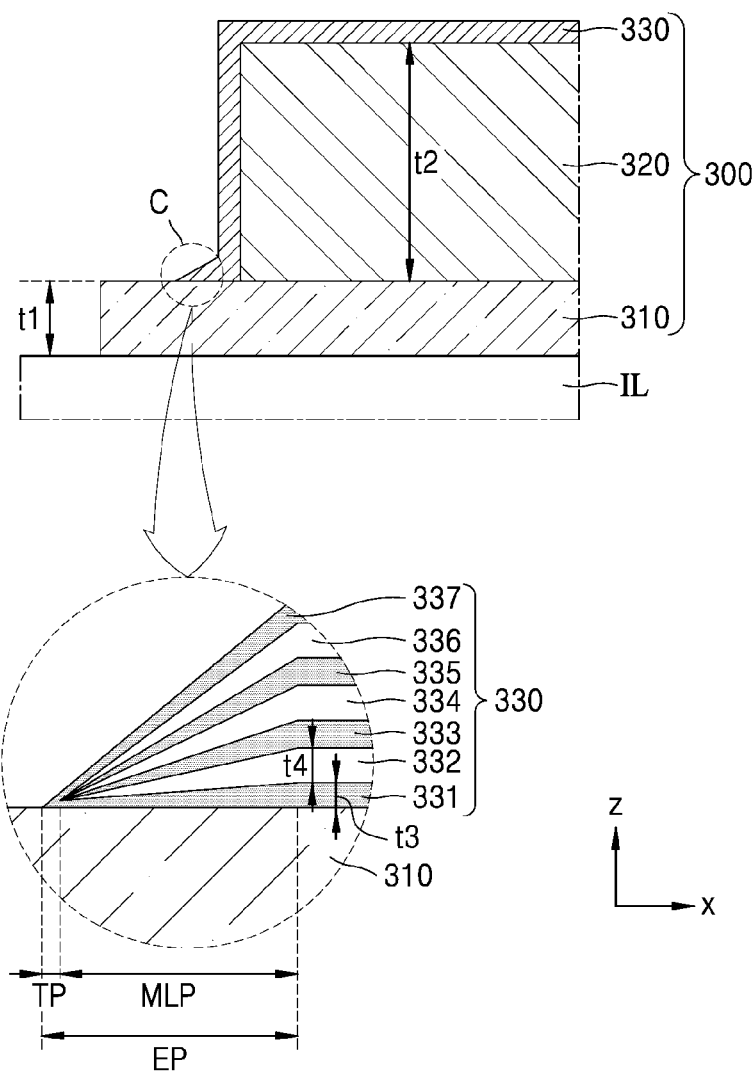
FIG. 5A is an enlarged cross-sectional view of region B of FIG. 4.
Figure 5B:
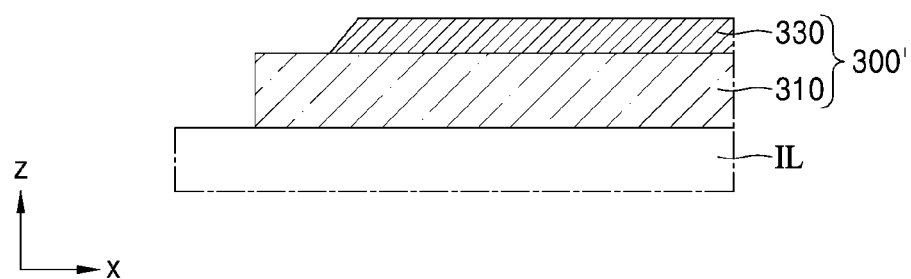
FIG. 5B is another enlarged cross-sectional view of region B of FIG. 4.
Figure 5C:
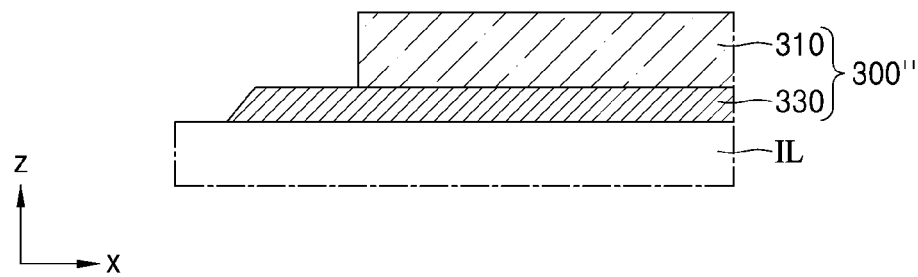
FIG. 5C is another enlarged cross-sectional view of region B of FIG. 4.

FIGS. 5A through 5C are enlarged cross-sectional views of region B of FIG. 4, and show various examples of region B.

First, according to an embodiment illustrated in FIG. 5A, the encapsulation portion 300 includes the inorganic encapsulation layer 310, an organic encapsulation layer 320, and a hybrid encapsulation layer 330. According to a present embodiment, the figure shows that the inorganic encapsulation layer 310, the organic encapsulation layer 320, and the hybrid encapsulation layer 330 are sequentially stacked on the inorganic insulating layer IL. However, embodiments are not limited thereto, and the number of encapsulation layers and the order in which the encapsulation layers are stacked may be modified in other embodiments.

According to an embodiment illustrated in FIG. 5A, the inorganic encapsulation layer 310 is the lowermost layer of the encapsulation portion 300 and includes at least one inorganic insulating material selected from aluminum oxide, titanium oxide, tantalum oxide, hafnium oxide, zinc oxide, $SiO_x$, $SiN_x$, or SiON. The inorganic encapsulation layer 310 is formed by using a chemical vapor deposition (CVD) method, and a thickness t1 of the inorganic encapsulation layer 310 is about 10,000 Å.

According to an embodiment illustrated in FIG. 5A, the organic encapsulation layer 320 is flexible and is disposed between the inorganic encapsulation layer 310 and the hybrid encapsulation layer 330. The organic encapsulation layer 320 includes one or more of PET, PEN, PC, PI, polyethylene sulfonate, polyoxymethylene, polyarylate, hexamethyldisiloxane, acryl-based resins, such as polymethyl methacrylate, polyacryl acid, etc., or a combination thereof. The organic encapsulation layer 320 is formed by injecting a monomer that includes the materials listed above and curing the injected monomer, by using an inkjet deposition method or a flash deposition method. A thickness t2 of the organic encapsulation layer 320 is about 40,000 Å.

According to an embodiment illustrated in FIG. 5A, the hybrid encapsulation layer 330 is the uppermost layer of the encapsulation portion 300. Referring to the drawing in which region C of the hybrid encapsulation layer 330 is enlarged, the hybrid encapsulation layer 330 has a structure in which inorganic layers and organic layers are sequentially and alternately stacked.

In detail, according to an embodiment, the hybrid encapsulation layer 330 includes inorganic layers that include a first inorganic layer 331, a second inorganic layer 333, a third inorganic layer 335, and a fourth inorganic layer 337, and organic layers that include a first organic layer 332, a second organic layer 334, and a third organic layer 336. The first organic layer 332 is disposed between the first inorganic layer 331 and the second inorganic layer 333, the second organic layer 334 is disposed between a second inorganic layer 333 and the third inorganic layer 335, and the third organic layer 336 is disposed between the third inorganic layer 335 and the fourth inorganic layer 337. However, this is exemplary and non-limiting, and the number of inorganic layers and the number of organic layers included in the hybrid encapsulation layer 330 and an order in which the inorganic layers and the organic layers are stacked may be modified in other embodiments.

According to an embodiment, each of the first through fourth inorganic layers 331, 333, 335, and 337 of the hybrid encapsulation layer 330 includes an ultra thin layer that has a nanoscale thickness, that is, a thickness of several nm through about 100 nm. For example, a thickness t3 of each of the first through fourth inorganic layers 331, 333, 335, and 337 of the hybrid encapsulation layer 330 is from about 100 Å through about 300 Å. In particular, the thickness t3 of each of the first through fourth inorganic layers 331, 333, 335, and 337 may be about 200 Å. Taking into account that the thickness t1 of the inorganic encapsulation layer 310 is about 10,000 Å, the thickness t1 of the inorganic encapsulation layer 310 is at least thirty times the thickness t3 of each of the first through fourth inorganic layers 331, 333, 335, and 337.

According to an embodiment, the first through fourth inorganic layers 331, 333, 335, and 337 of the hybrid encapsulation layer 330 are formed by using, as a source gas, a lightweight gas that has a relatively low molecular weight, such as silane ($SiH_4$) gas. According to an embodiment, the first through fourth inorganic layers 331, 333, 335, and 337 are formed by using an atomic layer deposition (ALD) method that uses $SiH_4$ gas as a source gas, and in this case, the first through fourth inorganic layers 331, 333, 335, and 337 include at least one of $SiN_x$, $SiO_x$, or SiON.

According to an embodiment, the first through third organic layers 332, 334, and 336 of the hybrid encapsulation layer 330 are also ultra thin layers. For example, a thickness t4 of the first through third organic layers 332, 334, and 336 of the hybrid encapsulation layer 330 is from about 500 Å through about 2000 Å. In particular, the thickness t4 of the first through third organic layers 332, 334, and 336 may be about 500 Å. Taking into account that the thickness t2 of the organic encapsulation layer 320 is about 40,000 Å, the thickness t2 of the organic encapsulation layer 320 is at least twenty times the thickness t4 of the first through third organic layers 332, 334, and 336.

According to an embodiment, the first through third organic layers 332, 334, and 336 of the hybrid encapsulation layer 330 are formed by using, as a source gas, a gas that has a relatively high molecular weight. According to an embodiment, the first through third organic layers 332, 334, and 336 are formed by using, as a source gas, a gas that includes a plasma polymer, and examples of a plasma polymer include hexamethyldisiloxane (HMDSO), furan, hexane, or a combination thereof. In this case, the first through third organic layers 332, 334, and 336 include at least one of HMDSO, furan, or hexane, so that the first through third organic layers 332, 334, and 336 include a different material from the organic encapsulation layer 320.

According to an embodiment, in the hybrid encapsulation layer 330, the thickness t4 of the first through third organic layers 332, 334, and 336 is greater than the thickness t3 of the first through fourth inorganic layers 331, 333, 335, and 337. To this end, the first through third organic layers 332, 334, and 336 may be formed by using a different method from the first through fourth inorganic layers 331, 333, 335, and 337. According to an embodiment, the first through third organic layers 332, 334, and 336 are formed by using a chemical vapor deposition (CVD) method, etc. However, the first through third organic layers 332, 334, and 336 may also be formed by using an ALD method, like the first through fourth inorganic layers 331, 333, 335, and 337.

As described above, according to an embodiment, the hybrid encapsulation layer 330 has a structure in which the nano-scale ultra thin inorganic layers and the nano-scale ultra thin organic layers are sequentially and alternately stacked, and thus, the hybrid encapsulation layer 330 is not broken or damaged even when strong external forces, such as bending or folding, is are applied to the hybrid encapsulation layer 330. Thus, the flexibility of a display apparatus that includes the hybrid encapsulation layer 330 having the structure described above may be easily realized.

According to an embodiment, to more closely describe the shape of region C of the hybrid encapsulation layer 330, an end portion EP of the hybrid encapsulation layer 330 includes a tip portion TP and a multi-layered portion MLP. The tip portion TP has an approximately pointed shape and is an end of the hybrid encapsulation layer 330. The multi-layered portion MLP extends from the tip portion TP toward a central portion of the substrate 100. That is, the multi-layered portion MLP extends in a +x direction and has a multi-layered structure that includes the first through fourth inorganic layers 331, 333, 335, and 337 and the first through third organic layers 332, 334, and 336. In detail, the multi-layered portion MLP includes the first through fourth inorganic layers 331, 333, 335, and 337 and the first through third organic layers 332, 334, and 336 that are sequentially and alternately stacked.

In the multi-layered portion MLP, according to an embodiment, each of the first through fourth inorganic layers 331, 333, 335, and 337 and the first through third organic layers 332, 334, and 336 has a thickness that decreases toward the tip portion TP. Accordingly, the overall cross-sectional shape of the end portion EP of the hybrid encapsulation layer 330 is approximately triangular or trapezoidal.

According to an embodiment, the lengths of the first through third organic layers 332, 334, and 336 in the end portion EP of the hybrid encapsulation layer 330 are less than the lengths of the first through fourth inorganic layers 331, 333, 335, and 337 in the end portion EP of the hybrid encapsulation layer 330. By this, the ends of the first through third organic layers 332, 334, and 336 may be covered by the first through fourth inorganic layers 331, 333, 335, and 337 to prevent penetration of water, foreign materials, etc., into the first through third organic layers 332, 334, and 336. In particular, reduction of the pixel P size, occurrences of dark spots, etc., because of water penetration into the organic light-emitting diode OLED through the first through third organic layers 332, 334, and 336, can be prevented.

Accordingly, according to an embodiment, the tip portion TP includes the end of each of the first through fourth inorganic layers 331, 333, 335, and 337, but not the ends of the first through third organic layers 332, 334, and 336, and thus, the tip portion TP may include only an inorganic material.

According to an embodiment, encapsulation portions 300' and 300" illustrated in FIGS. 5B and 5C are a modified example of the encapsulation portion 300 illustrated in FIG. 5A, and the organic encapsulation layer 320 of the encapsulation portion 300 illustrated in FIG. 5A is omitted in the encapsulation portion 300'.

According to an embodiment illustrated in FIG. 5B, like an embodiment illustrated in FIG. 5A, the inorganic encapsulation layer 310 and the hybrid encapsulation layer 330 are sequentially stacked on the inorganic insulating layer IL. In addition, an end of the hybrid encapsulation layer 330 away from a center portion of the substrate 100 is inclined with respect to the top surface of the inorganic encapsulation layer 310 and tapers to a tip. However, unlike an embodiment illustrated in FIG. 5A, the organic encapsulation layer 320 is omitted from between the inorganic encapsulation layer 310 and the hybrid encapsulation layer 330. According to a present embodiment, the first through third organic layers 332, 334, and 336 in the hybrid encapsulation layer 330 make the encapsulation portion 300' flexible, like the organic encapsulation layer 320 in an embodiment of FIG. 5A.

According to an embodiment illustrated in FIG. 5C, the order in which the inorganic encapsulation layer 310 and the hybrid encapsulation layer 330 are stacked is reversed with respect to the order illustrated in the embodiment with reference to FIG. 5B. In addition, an end of the hybrid encapsulation layer 330 in FIG. 5C tapers to a tip, similar to the end of the hybrid encapsulation layer 330 in FIG. 5B. According to a present embodiment, the organic encapsulation layer 320 is omitted from between the inorganic encapsulation layer 310 and the hybrid encapsulation layer 330, and thus, the first through third organic layers 332, 334, and 336 included in the hybrid encapsulation layer 330 make the encapsulation portion 300" flexible.

In addition, according to other embodiments, the encapsulation portion 300 lacks the inorganic encapsulation layer 310 and the organic encapsulation layer 320, and includes only the hybrid encapsulation layer 330. In this case, the first inorganic layer 331, which is the lowermost layer of the hybrid encapsulation layer 330, directly contacts an upper surface of the inorganic insulating layer IL. In addition, because the inorganic encapsulation layer 310 is omitted, the first through fourth inorganic layers 331, 333, 335, and 337 of the hybrid encapsulation layer 330 have an enhanced barrier function.

Hereinafter, a method of manufacturing a display apparatus according to an embodiment of the disclosure will be described in more detail with reference to FIGS. 6 and 7, etc.

Figure 6:
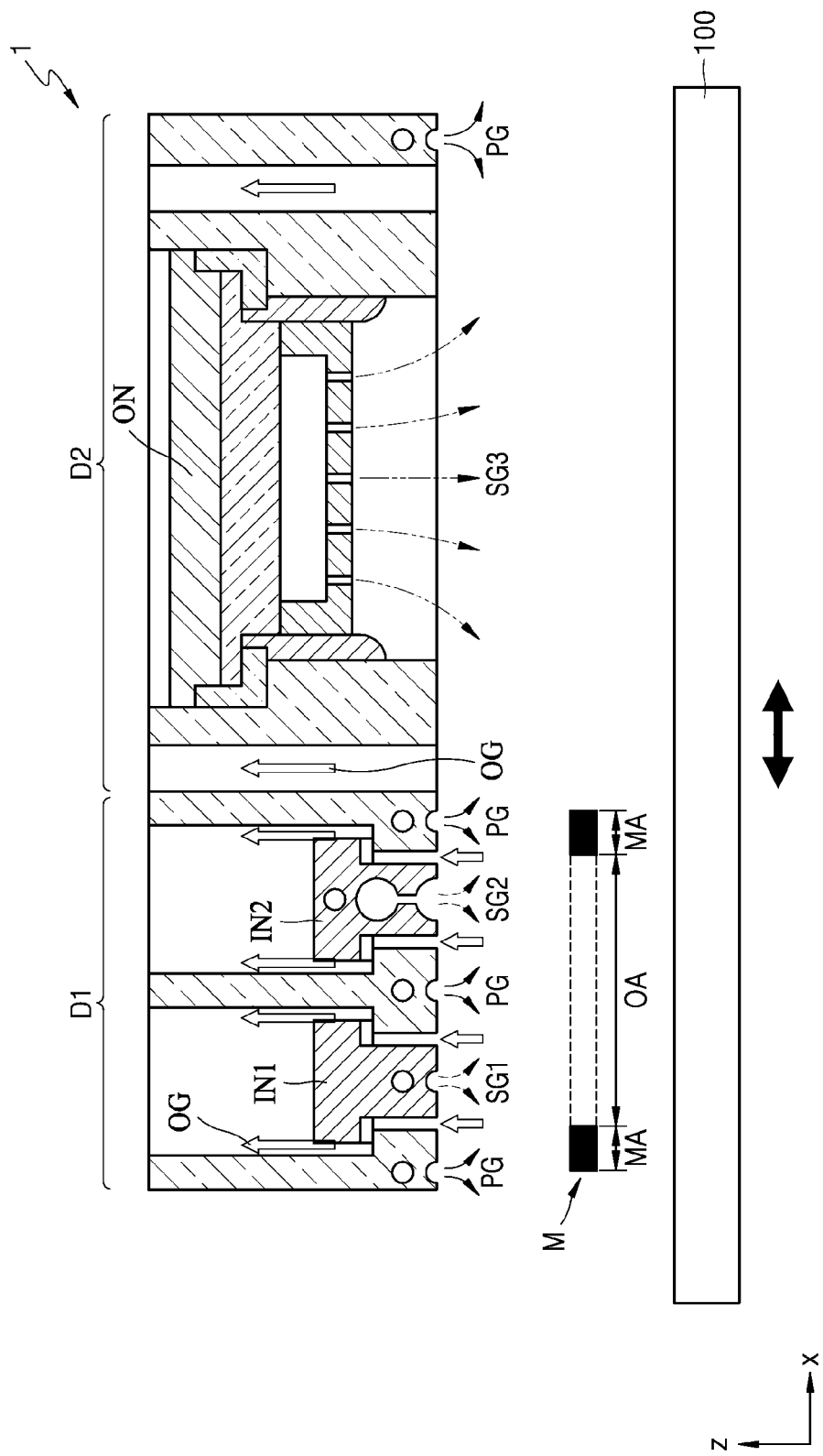
FIG. 6 is a cross-sectional view that illustrates a deposition process that manufactures a display apparatus, according to an embodiment.
Figure 7:
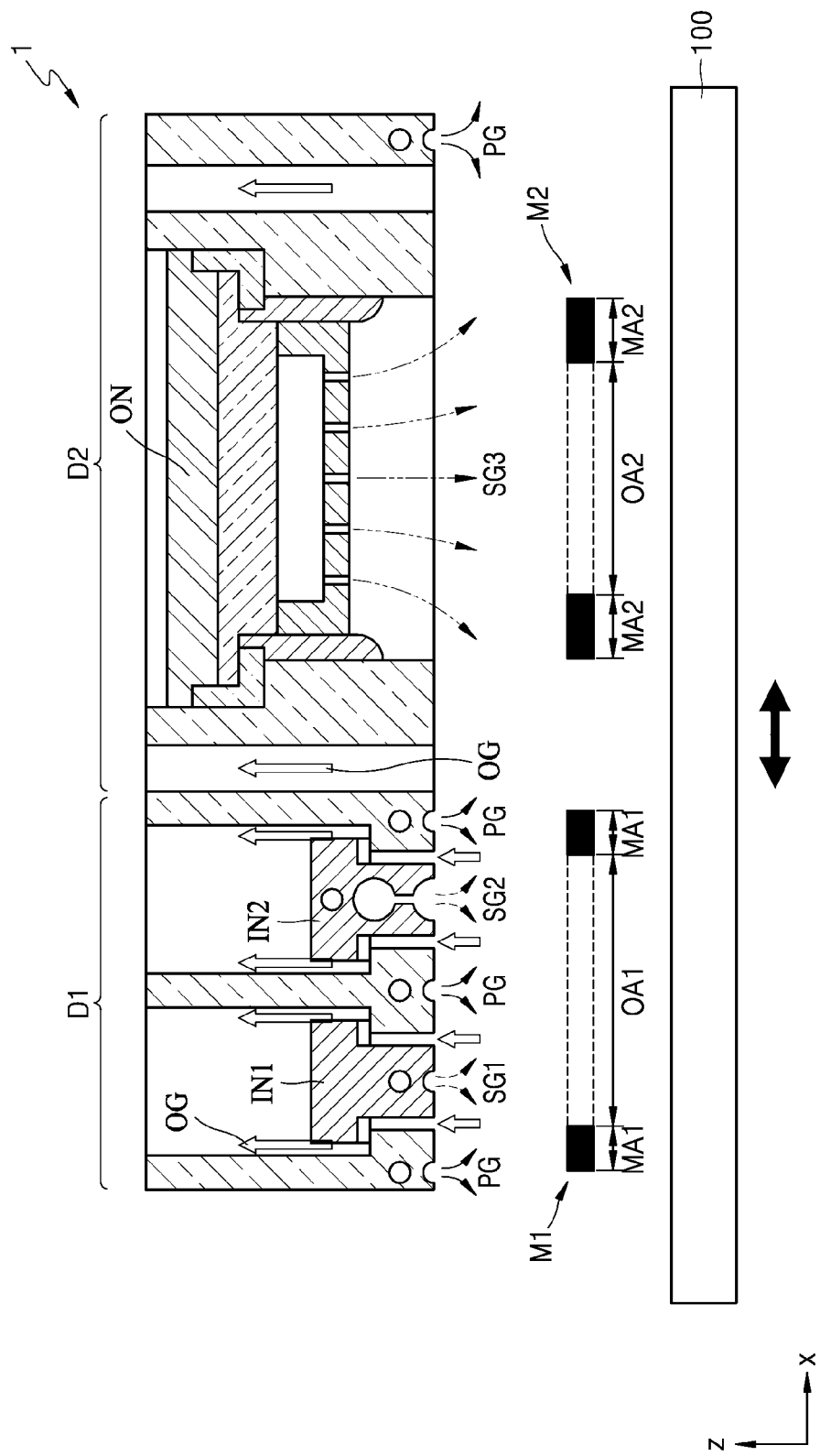
FIG. 7 is a cross-sectional view of a comparative example of a deposition process of FIG. 6.

FIG. 6 is a cross-sectional view that illustrates a deposition process that manufactures a display apparatus, according to an embodiment, and FIG. 7 is a cross-sectional view that illustrates a comparative example of a deposition process of FIG. 6.

According to an embodiment, FIG. 6 illustrates a process of depositing on the substrate 100 the first through fourth inorganic layers 331, 333, 335, and 337 of the hybrid encapsulation layer 330 shown in FIG. 5A, and the first through third organic layers 332, 334, and 336 shown in FIG. 5A, and illustrates a deposition apparatus 1 that performs the deposition process.

In detail, according to an embodiment, a deposition mask M is disposed on the substrate 100. The deposition mask M has an opening portion OA in a central portion thereof through which a deposition material is deposited, and a blocking portion MA around the opening portion OA that blocks the deposition of the deposition material. According to an embodiment, the mask M may be fixed on the substrate 100 and moves together with the substrate 100, or the mask M may be spaced apart from and above the substrate 100 and moves together with the substrate 100.

First, according to an embodiment, an ALD method is used to or an ultra thin inorganic layers 331, etc. of FIG. 5A, on the substrate 100.

According to an embodiment, a first deposition portion D1 of the deposition apparatus 1 that performs ALD includes a first inorganic layer nozzle portion IN1 and a second inorganic layer nozzle portion IN2 that respectively inject gases SG1 and SG2 that include different materials from each other. Here, one of the gases SG1 and SG2 is a first source gas SG1 that includes a main deposition material and the other source gas SG2 is a reaction gas that reacts with the first source gas SG1. According to an embodiment, the first source gas SG1 is $SiH_4$, which has a relatively low molecular weight. At a side of at least one of the first inorganic layer nozzle portion IN1 and the second inorganic layer nozzle portion IN2 is a purge gas supply portion that supplies a purge gas PG, and an exhaust gas OG may be discharged through openings between the purge gas supply portion and the first and second inorganic layer nozzle portions IN1 and IN2.

According to an embodiment, the first source gas SG1 together with the reaction gas SG2 are supplied to a predetermined region of the substrate 100 through the opening portion OA of the mask M to form the nanoscale inorganic layer, and the formed nanoscale inorganic layer has a thickness of from about 100 Å through about 300 Å.

Next, according to an embodiment, a CVD method is used to form an ultra thin organic layer 332, etc. of FIG. 5A, on the substrate 100.

According to an embodiment, a second deposition portion D2 of the deposition apparatus 1 performs a CVD method and includes an organic layer nozzle portion ON that injects a second source gas SG3 that includes a mixture of two different types of materials. According to an embodiment, the second source gas SG3 includes a gas that has a relatively high molecular weight as a main deposition material, and the second source gas SG3 also includes a plasma polymer that has a molecular weight that is at least two times that of the first source gas SG1.

According to an embodiment, when the first source gas SG1 is $SiH_4$, the second source gas GS3 has a molecular-weight at least two times the molecular weight of the $SiH_4$ gas, which is about 32.12 g/mol. According to an embodiment, the plasma polymer of the second source gas SG3 includes at least one of HMDSO, furan, or hexane. The molecular weight of HMDSO is about 182.38 g/mol, which is at least five times that of the $SiH_4$ gas, the molecular weight of furan is about 68.08 g/mol, which is at least two times that of the $SiH_4$ gas, and the molecular-weight of hexane is about 86.18 g/mol, which is at least 2.5 times that of the $SiH_4$ gas.

According to an embodiment, the purge gas supply portion that supplies the purge gas PG is located on at least a side of the organic, layer nozzle portion ON, and the exhaust gas OG is discharged through openings located between the purge gas supply portion and the organic layer nozzle portion ON.

According to an embodiment, the mask M disposed under the first deposition portion D1 and used to form the inorganic layer moves under the second deposition portion D2 and is used to form the organic layer. By this, the second source gas SG3 is supplied to a predetermined region of the substrate 100 through the opening portion OA of the mask M to form the nanoscale organic layer and the formed nanoscale organic layer has a thickness from about 500 Å to about 2000 Å.

Thereafter, according to an embodiment, the deposition process of the first deposition portion D1 and the deposition process of the second deposition portion D2 are alternately performed to form the hybrid encapsulation layer 330 of FIG. 5A in which the inorganic layers and the organic layers are alternately stacked. According to an embodiment, due to a difference in the molecular weight between the first source gas SG1 and the second source gas SG3, the inorganic layer, such as 333 of FIG. 5A, of the hybrid encapsulation layer 330 is formed to cover an end portion of the organic layer, such as 332 of FIG. 5A, of the hybrid encapsulation layer 330. Detailed description with respect to this aspect will be given below with reference to FIG. 8 and FIGS. 9A through 9C.

As described above, in a deposition process that manufactures an display apparatus according to an embodiment, the ultra thin first through fourth inorganic layers 331, 333, 335, and 337, and the ultra thin first through third organic layers 332, 334, and 336 of the hybrid encapsulation layer 330 can be formed by using the single mask M.

However, according to a deposition process according to a comparative example illustrated in FIG. 7, a first mask M1 is used to deposit the inorganic layers and a second mask M2 different from the first mask M1 is used to deposit the organic layers. That is, the first source gas SG1 injected from the first deposition portion D1 is supplied to the substrate 100 through an opening portion OA1 of the first mask M1, and the second source gas SG3 injected from the second deposition portion D2 is supplied to the substrate 100 through an opening portion OA2 of the second mask M2.

According to a comparative example, a difference in the molecular weight between the first source gas GS1 and the second source gas SG3 is be sufficiently great. For example, the molecular weight of the second source gas SG3 is less than two times the molecular-weight of the first source gas SG1.

Thus, according to a comparative embodiment, to form the inorganic layer, such as 333 of FIG. 5A, of the hybrid encapsulation layer 330 such that the inorganic layer of the hybrid encapsulation layer 330 covers an end of the organic layer, such as 332 of FIG. 5A, of the hybrid encapsulation layer 330, a second mask M2 has to be additionally included that has a smaller opening portion OA2 the opening portion OA1 of the first mask M1.

According to a comparative embodiment, the mask for depositing the inorganic layer and the mask for depositing the organic layer differ from each other, and thus, the masks need to be repeatedly replaced in a process of alternately stacking the inorganic layers and the organic layers. As a result, a deposition process of the hybrid encapsulation layer 330 according to a comparative embodiment has increased processing time as compared to a deposition process of the hybrid encapsulation layer 330 according to an embodiment of the disclosure.

Figure 8:
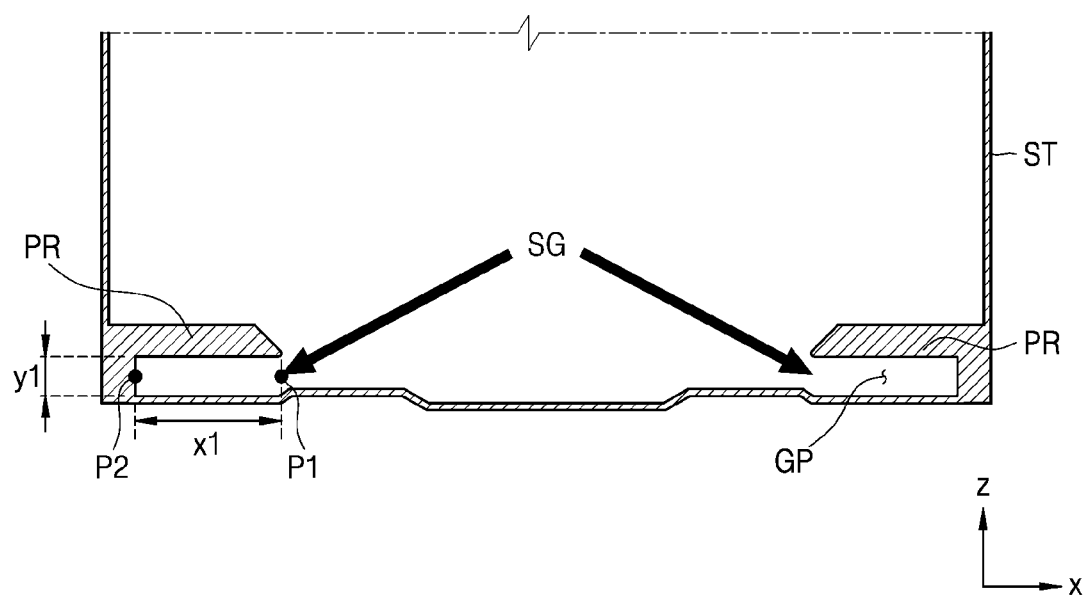
FIG. 8 is a cross-sectional view of a structure that simulates a deposition process that manufactures a display apparatus, according to an embodiment.
Figure 9A:
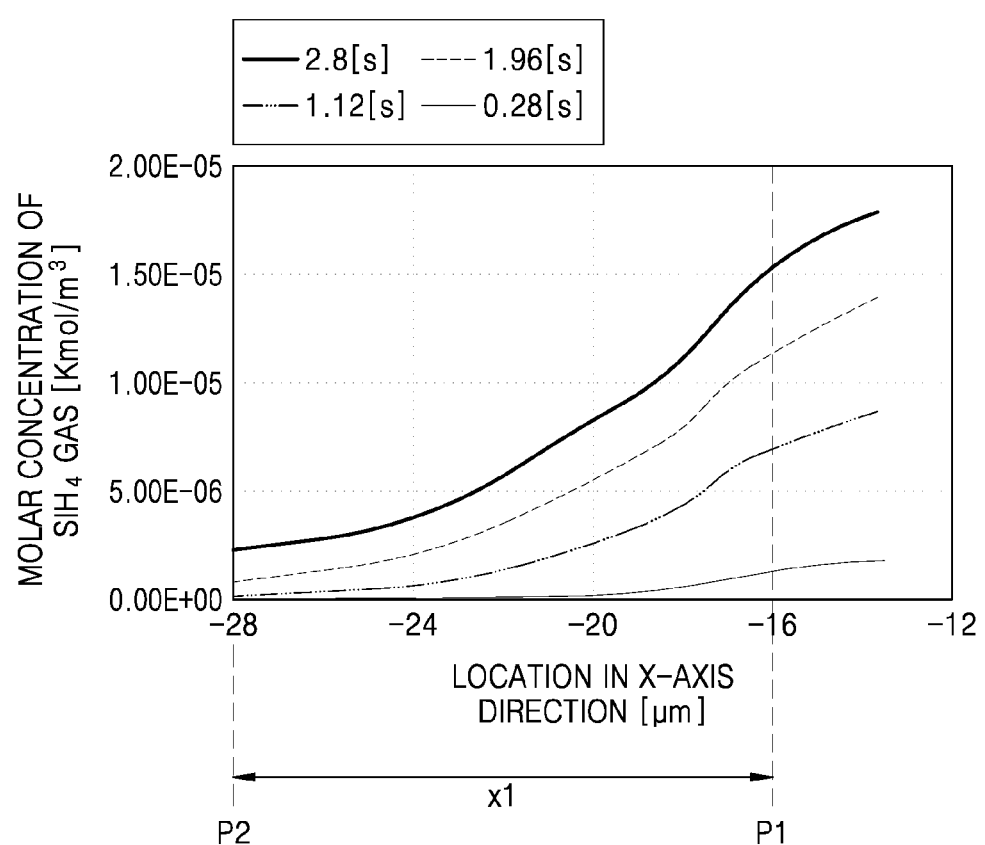
FIGS. 9A through 9C are graphs of results of the simulated deposition processes that use a structure of FIG. 8.
Figure 9B:
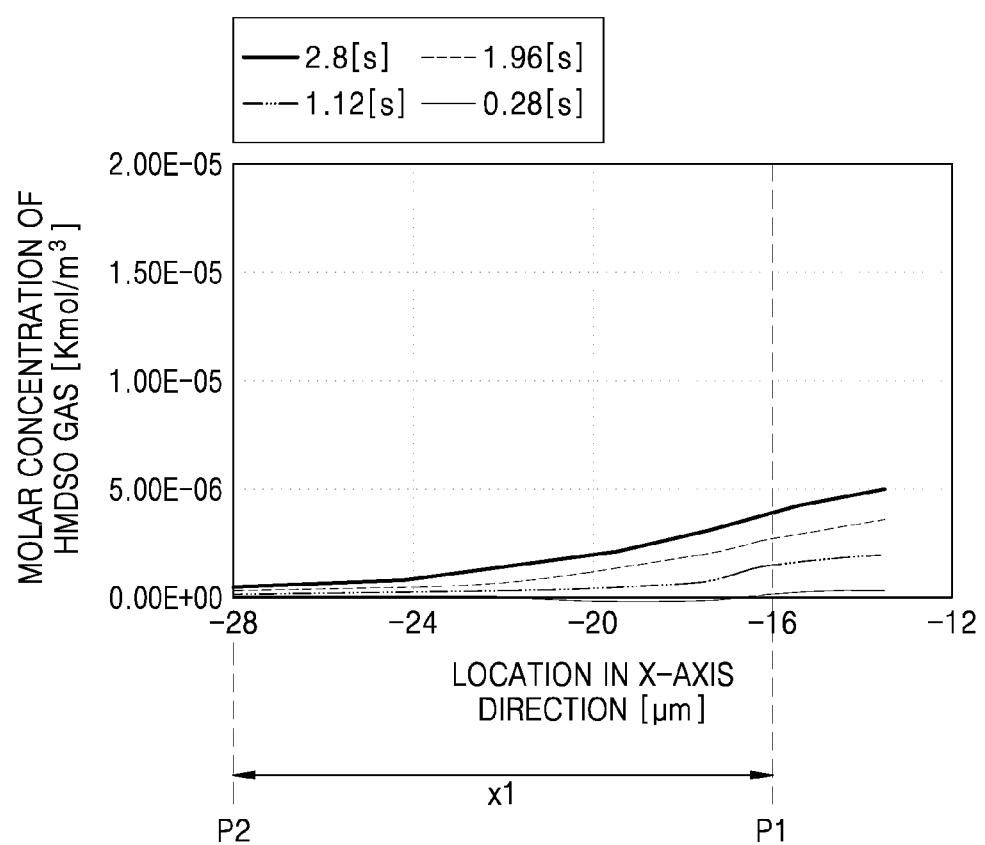
Figure 9C:
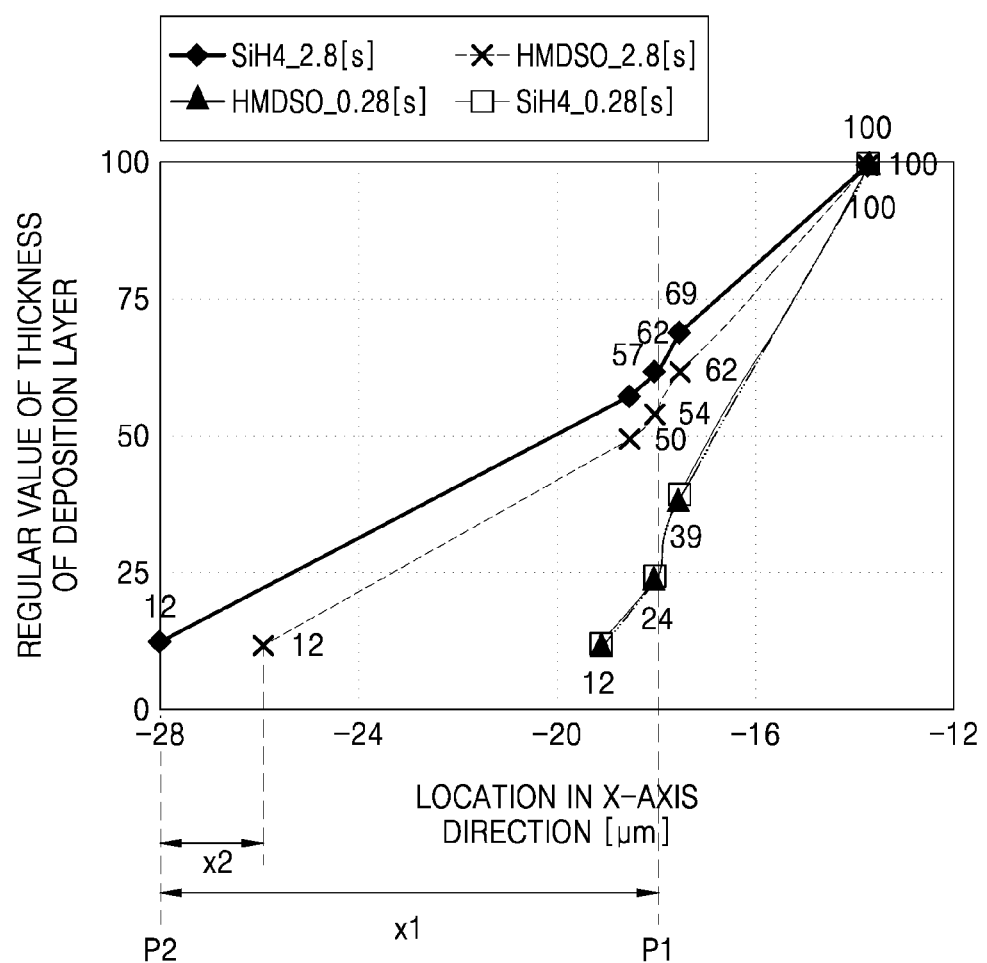
Figure 10:
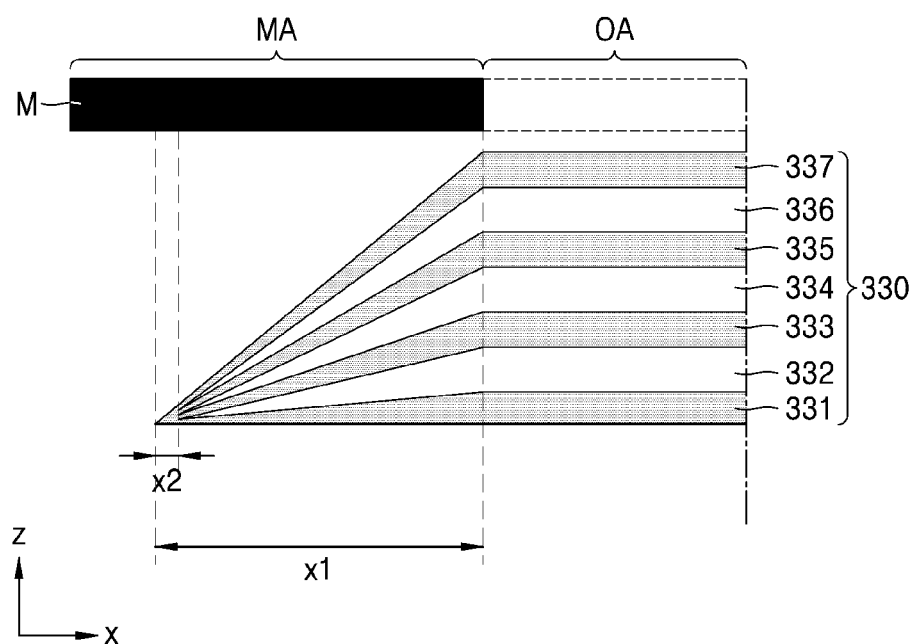
FIG. 10 is a cross-sectional view of a deposition result of a deposition process that manufactures a display apparatus, according to an embodiment.

FIG. 8 is a cross-sectional view of a structure ST that simulates a deposition process that manufactures a display apparatus, according to an embodiment, FIGS. 9A through 9C are graphs of results of the simulated deposition processes, and FIG. 10 is a cross-sectional view of a deposition result of a deposition process that manufactures a display apparatus, according to an embodiment.

According to an embodiment, the structure ST illustrated in FIG. 8 is a simulation model that shows a difference between a length (or an area) in which an inorganic layer is deposited and a length (or an area) in which an organic layer is deposited, due to differences between the molecular weights of the source gas for the inorganic layer and the source gas for the organic layer.

According to an embodiment, the structure ST has an empty space inside, and the source gas SG spreads downwards through the empty space. A protrusion portion PR that protrudes toward the inside is included in the structure ST and the protrusion portion PR corresponds to the blocking portion MA, shown in FIG. 10, of the mask in the deposition process described above. A gas passage GP is formed at a lower portion of the protrusion portion PR and corresponds to a space on the substrate under the blocking portion MA of the mask. Here, a distance between a start portion P1 of the gas passage GP and an end portion P2 of the gas passage GP located by an end of the protrusion portion PR is x1 in an x-axis direction and a height of the gas passage GP is y1 in a z-axis direction.

Thus, according to an embodiment, a distance between the inorganic layer and the organic layer that form the end EP of the hybrid encapsulation layer 330 in the x-axis direction can be simulated using a deposition result of the source gas SG in the gas passage GP.

FIGS. 9A and 9B respectively show the variations in molar concentrations of and HMDSO between the start portion P1 and the end portion P2 of the gas passage GP for gas exposure times of 0.28 seconds through 2.8 seconds, after $SiH_4$ gas and HMDSO gas are sequentially supplied as the source gas SG to the structure ST of FIG. 8. Here, the gas exposure time corresponds to a scan speed of the deposition on the substrate, and an increased gas exposure time corresponds to a slower scan speed of the deposition on the substrate.

Referring to the graphs of FIGS. 9A and 9B, according to an embodiment, the molar concentration of HMDSO is less than the molar concentration of $SiH_4$. In addition, it is shown that at the shortest exposure time of 0.28 seconds, the difference is relatively small, but at the longest exposure time of 2.8 seconds, the difference is great. Thus, to increase the difference in the molar concentration between $SiH_4$ and HMDSO, the scan speed of the deposition on the substrate is adjusted such that the gas exposure time is equal to or greater than about 2.8 seconds.

FIG. 9C illustrates a result of a simulation with a gas exposure time of 2.8 seconds. Referring to FIG. 9C, when the comparison between $SiH_4$ and HMDSO is based on a 2.8 second exposure time, the lighter $SiH_4$ moves from the start portion P1 of the gas passage GP by a distance of x1 in an −x direction, while the heavier HMDSO moves from the start portion P1 of the gas passage GP by a distance of x1-x2 in the −x direction. Thus, during an exposure time of 2.8 seconds, it can be predicted that an inorganic layer formed with $SiH_4$ as the source gas SG is formed to be longer by the length x2 than an organic layer formed with HMDSO as the source gas SG.

Thus, according to an embodiment, as illustrated in FIG. 10, a length of the tip portion TP shown in FIG. 5A of the hybrid encapsulation layer 330 formed under the blocking portion MA of the mask M corresponds to the length x2 derived from the result of the simulation illustrated in FIG. 9C. That is, with an edge between of the opening portion OA and the blocking portion MA of the mask M as a start point, the length of the end of the first through fourth inorganic layers 331, 333, 335, and 337 in the x-axis direction is about x1, which is longer than the length of the end of the first through third organic layers 332, 334, and 336 in the x-axis direction by x2.

As described above, according to an embodiment, by using the difference in the molecular weights between the inorganic layer source gas and the organic layer source gas, the deposition lengths (or areas) of the inorganic layer and the organic layer can be formed to be different from each other by using a single mask.

According to exemplary embodiments of the disclosure as described above, the flexibility of the encapsulation layer that encapsulates the display device can be improved.

However, the scope of embodiments of the disclosure is not limited by these effects.

It should be understood that exemplary embodiments described herein should be considered in a descriptive sense only and not for purposes of limitation. Descriptions of features or aspects within each embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus, comprising:
a substrate;
a display portion that includes a plurality of pixels disposed on the substrate; and
an encapsulation portion that covers the display portion and includes an inorganic encapsulation layer and a hybrid encapsulation layer that includes a plurality of inorganic layers and a plurality of organic layers that includes a plasma polymer,
wherein an end of the hybrid encapsulation layer includes a tip portion that includes ends of only the plurality of inorganic layers and a multi-layered portion that extends from the tip portion toward a central portion of the substrate and in which the plurality of inorganic layers and the plurality of organic layer are sequentially and alternately stacked,
wherein each of the plurality of organic layers is interposed between a pair of inorganic layers and the inorganic encapsulation layer is in contact with an outermost inorganic layer of the plurality of inorganic layers,
a thickness of each of the plurality of inorganic layers and the at least one organic layer of the multi-layered portion decreases toward the tip portion,
each of the inorganic layers has a thickness of about 100 Å to about 300 Å,
each of the plurality of organic layers has a thickness of from about 500 Å to about 2000 Å, and
the tip portion has a length in a direction parallel to the substrate,
the display portion further comprises:
an inorganic insulating layer on the substrate, and
a planarization insulating layer between the inorganic insulating layer and the encapsulation portion,
the inorganic insulating layer and the encapsulating portion extend from an end of the planarization insulating layer and directly contact each other, and
the substrate and the inorganic insulating layer protrude from the end of the planarization insulating layer in a direction away from the plurality of pixels.

2. The display apparatus of claim 1, wherein the plasma polymer includes at least one of hexamethyldisiloxane (HMDSO), furan, or hexane.

3. The display apparatus of claim 1, wherein
a thickness of the inorganic encapsulation layer is at least thirty times a thickness of each of the plurality of inorganic layers.

4. The display apparatus of claim 1, wherein the inorganic layers include at least one of silicon nitride, silicon oxide, or silicon oxynitride.

5. The display apparatus of claim 1, wherein the tip portion includes only an inorganic material.

6. The display apparatus of claim 1, wherein
the encapsulation portion further includes an organic encapsulation layer, and
a thickness of the organic encapsulation layer is at least twenty times a thickness of the at least one organic layer.

7. The display apparatus of claim 6, wherein
the organic encapsulation layer is disposed between the inorganic encapsulation layer and the hybrid encapsulation layer.

8. A method of manufacturing a display apparatus, the method comprising:
forming a display portion on a substrate, wherein the display portion includes a plurality of pixels; and
forming an encapsulation portion on the substrate, wherein the encapsulation portion covers the display portion,
wherein forming the encapsulation portion comprises:
forming an inorganic encapsulation layer on the substrate,
forming a plurality of inorganic layers on the substrate by using a first source gas as a deposition material; and
forming a plurality of organic layers on the substrate by using, as a deposition material, a second source gas that includes a plasma polymer that has a molecular weight that is at least two times a molecular weight of the first source gas,
wherein forming each of the plurality of organic layers includes supplying the second source gas to the substrate using a same mask used in forming each of the plurality of inorganic layers, and wherein an area of each of the plurality of organic layers in a plan view and an area of the each of the plurality of inorganic layers in a plan view are different from each other, wherein each of the plurality of organic layers is formed between a pair of inorganic layers and the inorganic encapsulation layer is in contact with an outermost inorganic layer of the plurality of inorganic layers.

9. The method of claim 8, wherein the first source gas includes silane (SiH4).

10. The method of claim 8, wherein the plasma polymer includes at least one of hexamethyldisiloxane (HMDSO), furan, or hexane.

11. The method of claim 8, wherein forming the inorganic layers and forming the organic layers are sequentially and alternately performed.

12. The method of claim 8, wherein forming the inorganic layers includes using an atomic layer deposition (ALD) method.

13. The method of claim 8, further comprising
wherein a thickness of the inorganic encapsulation layer is at least a thickness of each of the plurality of inorganic layers.

14. The method of claim 8, further comprising:
forming an organic encapsulation layer on the substrate,
wherein a thickness of the organic encapsulation layer is at least twenty times a thickness of the at least one organic layer.

15. The method of claim 8, wherein
each of the plurality of inorganic layers has a thickness of about 100 Å to about 300 Å, and
the at least one organic layer has a thickness of about 500 Å to about 2000 Å.

* * * * *